METHOD OF FORMING SEMICONDUCTOR REGIONS IN AN EPITAXIAL LAYER

Filed Aug. 21, 1967 2 Sheets-Sheet 1

INVENTOR
Paul S. Gleim
Edgar C. Teague
BY
ATTORNEY

METHOD OF FORMING SEMICONDUCTOR REGIONS IN AN EPITAXIAL LAYER

Filed Aug. 21, 1967 2 Sheets-Sheet 2

United States Patent Office 3,533,862

Patented Oct. 13, 1970

3,533,862
METHOD OF FORMING SEMICONDUCTOR REGIONS IN AN EPITAXIAL LAYER

Paul S. Gleim, Dallas, and Edger Clayton Teague, Richardson, Tex., assignors to Texas Instruments Incorporated, Dallas, Tex., a corporation of Delaware Filed Aug. 21, 1967, Ser. No. 662,172
Int. Cl. H01l 7/34, 7/36
U.S. Cl. 148—175 6 Claims

ABSTRACT OF THE DISCLOSURE

Disclosed is a method of forming regions of opposite conductivity-type in an epitaxially deposited semiconductor layer during its deposition on a semiconductor substrate by the use of controlled deposition conditions and a thermal pattern on the surface of the substrate. Semiconductor material of one conductivity-type is deposited on the thermal pattern while opposite conductivity-type semiconductor material is deposited on the remainder of the substrate, thus forming a pattern of P-N junctions between adjacent regions corresponding to the thermal pattern.

This invention relates to semiconductors and more particularly to a method of selectively forming regions of opposite conductivity-type in an epitaxially deposited layer on a semiconductor substrate.

In the present state of the semiconductor art, regions of opposite conductivity-type from the conductivity-type of an epitaxially deposited layer of semiconductor material are conventionally formed by diffusing impurities into portions of the surface of the epitaxial layer after the layer is deposited, thus necessitating a plurality of operations whereas for certain devices or integrated circuits such as those requiring isolation regions, for example, it would be more economical if the isolation regions could be formed during the deposition of the epitaxial layer.

Accordingly, it is an object of this invention to provide a method of forming selected regions of different conductivity-type in an epitaxially deposited semiconductor layer by controlling the deposition conditions during the deposition of the layer on a semiconductor substrate.

The novel features believed to be characteristic of this invention are set forth with particularity in the appended claims. The invention itself, however, as well as further objects and advantages thereof may best be understood by reference to the following detailed description when read in conjunction with the accompanying drawings, wherein:

Figures 1, 2:
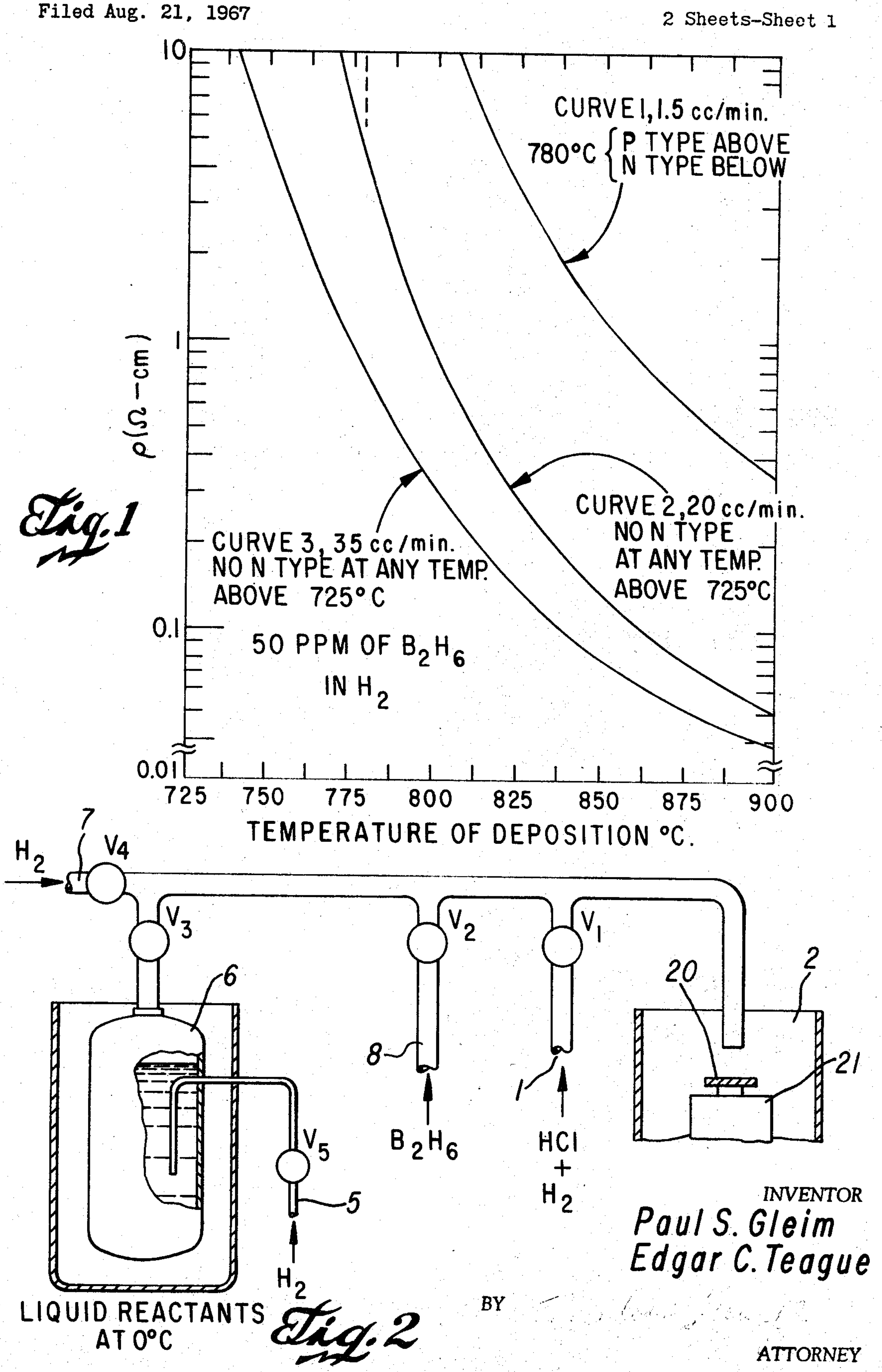
FIG. 1 is a graph on a logarithmic scale illustrating a family of curves at different boron hydride ($B_2H_6$) flow rates, showing the resistivity of epitaxially deposited layers of germanium versus temperature of deposition with boron as the impurity modifier.
FIG. 2 is a pictorial view, partly in section, of an epitaxial deposition apparatus which may be used to form regions of opposite conductivity-type in an epitaxial layer according to the invention.
Figure 3:
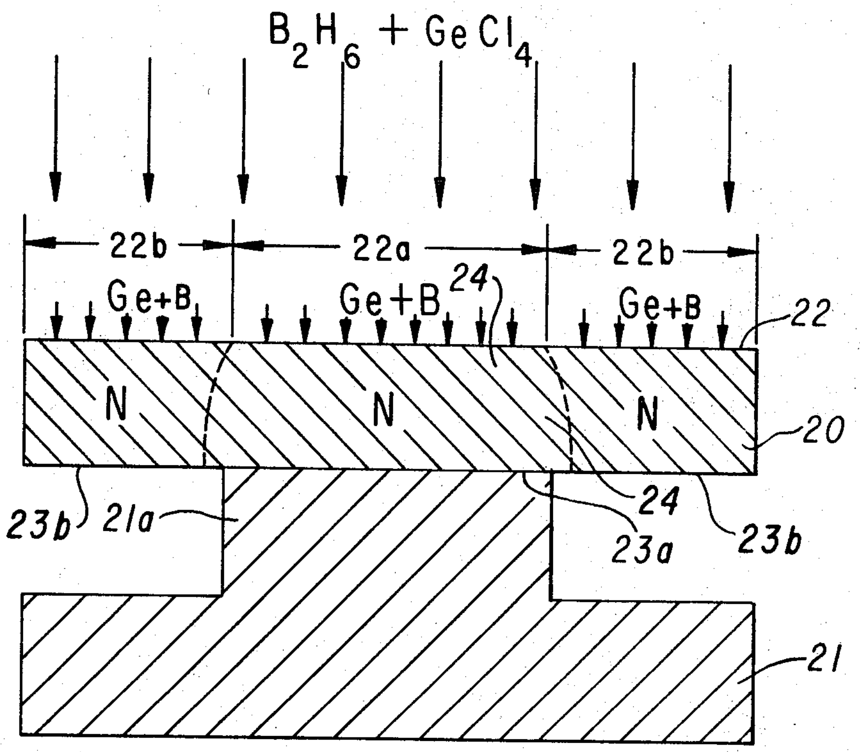
FIG. 3 is a pictorial view, in section, of a germanium substrate disposed on a heated susceptor depicting the epitaxial deposition of N and P conductivity-type germanium on a differentially heated substrate.

In brief, the invention utilizes the temperature dependence of the reaction rate of a doping compound having an impurity of one conductivity-type and the use of a thermally patterned semiconductor substrate of opposite conductivity-type to form regions of different conductivity-type in an epitaxial layer as the layer is being deposited on the surface of a semiconductor substrate. By careful control of the temperature pattern on the surface of the substrate, the impurity concentration of the substrate and the flow rate of the doping compound, the portions of the epitaxial layer deposited on the hotter or patterned portions of the substrate will be of the same conductivity-type as the impurity of the doping compound, whereas the portions of the epitaxial layer over the cooler or remaining portions of the substrate will be of the same conductivity-type as the substrate which is of the opposite conductivity-type from the impurity in the doping compound. Different temperature dependence of the doping reactions could give the opposite effect.

Impurities which are incorporated into a growing epitaxial layer produced by chemical vapor deposition may be classified into four broad categories: (1) impurities contained within or absorbed on the materials used in the construction of the flow system and reactor; (2) impurities resulting from the substrate, either by solid state diffusion, gaseous transport, or a combination of these two; (3) impurities contained in the material used for layer deposition, such as hydrogen, hydrogen chloride and germanium or silicon tetrachloride; and (4) impurities intentionally introduced into the reactor.

Impurities arising from the reactor system and the materials used for deposition are generally minimized as much as possible. Control of epitaxial layer resistivity, which is principally determined by the impurities in a semiconductor, is therefore achieved by controlling the impurities in the substrate and the intentional introduced impurities in the reactor. By a novel method of controlling the impurity concentration in the starting substrate, the relation of the conductivity-type of the substrate to the conductivity-type of the doping impurity and utilizing the temperature dependence of doping compounds, regions of different conductivity-type can be deposited simultaneously.

There are many studies in the literature of impurities in an epitaxial layer resulting from the underlying substrate; for example, see H. Basseches, S. K. Tung, R. G. Manz and C. D. Thomas, Metallurgy of Semiconductor Materials 15 69 (1962). Three effects are believed to be present during the growth process. First, there is a simple solid state diffusion of impurities from a step impurity concentration profile between that of the substrate and of the background concentration of the layer determined by impurities in the reactor system material and intentionally introduced impurities; second, there is an anomalously high impurity concentration near the substrate-layer interface, with a possible explanation in terms of enhanced diffusion rates being associated with defects in the crystalline growth at the interface; and third, there is an incorporation into the growing epitaxial layer of impurities from the substrate itself, exiting from its back surface or the surface of the growing epitaxial layer or both, and other impurities intentionally introduced into the reaction system. Excluding the intentionally introduced impurities, it appears that factors 1 and 3 are the most dominant processes for the usual epitaxial deposition conditions.

The effect of substrate impurities observed in the vapor deposition of silicon, germanium and gallium arsenide have been reported in the literature, for example: B. A. Joyce, J. C. Weaver and D. J. Aule, Journal of Electrochemical Society, 112 (1965), for silicon; Texas Instruments Quarterly Reports Nos. 3, 4, and 5, Contract No. DA-28-043, AMC-01371(E), U.S. Army Electronics Command, Ft. Monmouth, N.J., for germanium; and K. L. Lawley, Journal of Electrochemical Society, 113 No. 3 (1966), for gallium arsenide.

The thermodynamics of impurity dopant reactions in the vapor deposition of germanium by iodide disproportionation has been described in a series of articles, for example, T. Arizumi and I. Akaski, Japanese Journal of Applied Physics 2 602 (1963); Japanese Journal of Applied Physics 3 87 (1964), whereas an experimental study of the temperature dependence of different dopant reactions taking place in silicon deposition by the tetrachloride process has been described in R. Nutall Journal of Electrochemical Society, 11 317 (1964) for antimony trichloride ($SbCl_3$), phosphorous trichloride ($PCl_3$), and boron bromide ($BBr_3$).

FIGS. 1–4 illustrate the invention as it relates to only two materials, germanium as the semiconductor material and boron as the impurity material, from a number of possible semiconductor and impurity materials. Only one specific example is given, for nothing would be gained by illustratively describing the use of different combinations of semiconductor and impurity materials. Germanium, silicon and gallium arsenide are examples of semiconductor materials that can be deposited along with the appropriate impurity materials. Such impurity materials as the Group III and IV compounds containing boron, indium, arsenic and phosphorus, for example, can be used to dope germanium and silicon. Group II, IV, and VI elements and compounds, containing zinc, cadmium, silicon, germanium, selenium and sulfur, for example, can be used to dope gallium arsenide. The reaction rate of some doping compounds such as $BCl_3$ increases with increasing temperature, while for other doping compounds, such as $BBr_3$, the reaction rate decreases with increasing temperature. Thus, it is possible to use the relationship of the substrate conductivity-type to the conductivity-type of the doping compound and the direction of the hydrogen reduction reaction with changes in temperature to form specific regions of either N or P conductivity-type in an epitaxial layer.

Referring now to the figures, FIG. 1 shows the effect that the substrate temperature and the flow rate of a doping compound, diborane ($B_2H_6$), have on the conductivity-type of an epitaxially deposited germanium layer. As will be described in greater detail later, diborane breaks down readily at low temperatures when introduced into a reactor containing chloride and hydrogen to form boron chloride ($BCl_3$), whose reduction rate by hydrogen is temperature dependent. The deposition temperature and dopant flow rate are closely controlled in order to obtain the desired deposition of the boron doped (P type) and essentially boron free regions on an N type germanium substrate, the boron free regions gaining impurities of N type from the underlying substrate. For example, as seen from curve 1, if the portions of the substrate where it is desired to deposit N type germanium are maintained at about 780° C., very little boron is free to deposit and the deposited germanium is N type, the same type as the substrate. On the other hand, if portions of the substrate where it is desired to deposit P type germanium are maintained at about 830° C., or about 50° C. hotter than the colder portions of the substrate, much more boron is free to deposit, so that the deposited germanium layer thus contains enough boron to overcome the N type impurities being incorporated in the layer from the substrate to cause the layer to be P type.

The resistivities of both the P and N type regions, of course, are controlled by varying the temperatures of the different portions of the substrate, the impurity concentration of the substrate and the dopant flow. Also, the conductivity-type of the respective regions can be reversed by using a P type substrate and an N type doping compound containing, for example, phosphorus. It should be obvious from curve 1 that with an increase in deposition temperature, there is a gradual increase in the rate of boron deposition. However, the transition from N to P type is abrupt enough to form an effective P-N junction. The flow rates of boron hydride shown on curve 2 and curve 3 are great enough that with any substrate temperature high enough to cause deposition of germanium on the heated substrate, sufficient boron will be deposited along with germanium to form only P type material.

A conventional epitaxial deposition system is shown in FIG. 2 with its operation as follows: hydrogen chloride gas (HCl) in a hydrogen carrier gas ($H_2$) is introduced through inlet 1 and control valve $V_1$ into the reaction chamber 2 after the substrate 20 has been raised to the desired temperature by the heated support or susceptor 21 in order to clean the surface of the substrate 20 on which the epitaxial layer is to be deposited, valves $V_2$, $V_3$, $V_4$, and $V_5$ being closed at this time. After a period of time sufficient to clean the surface of the substrate 20, the hydrogen chloride gas flow is stopped by closing valve $V_1$. Hydrogen is then allowed to flow through the inlet 5 and valve $V_5$ into the chamber 6 containing a reactant liquid of a compound of the semiconductor material to be deposited, which, in the case of germanium, is most generally liquid germanium tetrachloride ($GeCl_4$). The hydrogen gas bubbling through the reactant liquid in the chamber 6 is saturated with germanium tetrachloride vapor. By opening valves $V_3$ and $V_4$, the gaseous mixture of $H_2$ and $GeCl_4$ vapor passes into the main hydrogen stream introduced through inlet 7, and the combination of the gases finally passes on into the reaction chamber 2 to impinge upon the surface of the substrate 20. Due to the temperature at which the substrate 20 is maintained by the heat from the susceptor 21, the germanium tetrachloride vapor, upon striking the surface of the substrate, reacts with hydrogen according to the hydrogen reduction reaction, $$2H_2+GeCl_4 \rightarrow Ge+4HCl$$

to form elemental germanium and hydrogen chloride, the former depositing on the surface of the substrate and the latter reacting with the dopant, diborane ($B_2H_6$), to form boron chloride ($BCl_3$), according to the reaction $B_2H_6+6HCl \rightarrow 2BCl_3+6H_2$, the diborane from source 8 having been introduced into the reaction chamber 2 by opening valve 2 at the same time as the reactant from chamber 6 passes into the main hydrogen stream 7. The reaction rate of boron chloride to form elemental boron according to the reaction $BCl_3+\frac{3}{2}H_2 \rightarrow B+3HCl$ is temperature-dependent, so that the formation of boron can be controlled by controlling the temperature of the substrate surface. Another temperature sensitive reaction which is believed to be taking place is $BH_3 \rightarrow B+\frac{3}{2}H_2$. The amount of dopant-vapor in the reactor chamber 2 is, of course, controlled by the flow of diborane through inlet 8. The flow of the gaseus mixture of germanium tetrachloride, diborane and hydrogen is fed into the reaction chamber 2 until a sufficient thickness of epitaxially deposited material is achieved on the substrate 20.

No particular method of heating is required to give the desired controlled variation of temperature across the surface of the substrate 20 on which the layer of material with different conductivity-type regions is to be epitaxially deposited. Such heating methods as the use of an arc-image furnace with appropriate optical masking and background heating of the substrate by another heat source, a laser with associated equipment or a patterned heated susceptor can be used. For ease of description, however, only the use of a heated susceptor is described in conjunction with FIG. 3. An N type germanium substrate 20 is placed on a patterned susceptor 21 made of a good heat conductor, such as graphite and heated by any convenient means, such as resistance heating. The susceptor is patterned so that a raised part 21$a$ supports a portion 23$a$ of one surface of the substrate 20 with other portions 23$b$ extending free of contact with the heated susceptor.

Thus, the heat from the heated susceptor, the hotter portion of the substrate, indicated generally within the area 24 enclosed by the dashed lines, causes the portion 22*a* of the top surface 22 of the substrate to be at a higher temperature than the temperature of the portions 22*b*. The portion 22*a* of the surface 22 of the germanium substrate 20 now exhibits a thermal pattern, substantially the pattern formed by the susceptor contacting the bottom surface 23 of the substrate.

The germanium substrate 20 resting on the heated susceptor is exposed to a diborane, hydrogen and germanium tetrachloride atmosphere, introduced into the reaction chamber 2 by the apparatus as described in conjunction with FIG. 2. The large arrows in FIG. 3 indicate the flow of the diborane and germanium tetrachloride vapor toward the surface of the substrate and the smaller arrows represent the deposition of germanium and boron on the substrate 20, the germanium depositing generally uniformly across the surface with the boron depositing at a much greater rate on the hot portion 22*a* (represented by a large B) than on the colder portions 22*b* (represented by a small B). As previously explained, the rate of reaction of boron chloride and the deposition of boron in the layer of germanium on the surface of the substrate 20 is dependent upon the substrate temperature and the amount of boron hydride flowing into the reaction chamber. The temperature of the thermal patterned portion 22*a* of the substrate surface 22 and the flow rate of boron hydride are controlled so that only the portion 22*a* is at a sufficiently high temperature to cause elemental boron to form at a fast enough rate to substantially affect the conductivity-type of the germanium being deposited.

Figure 4:
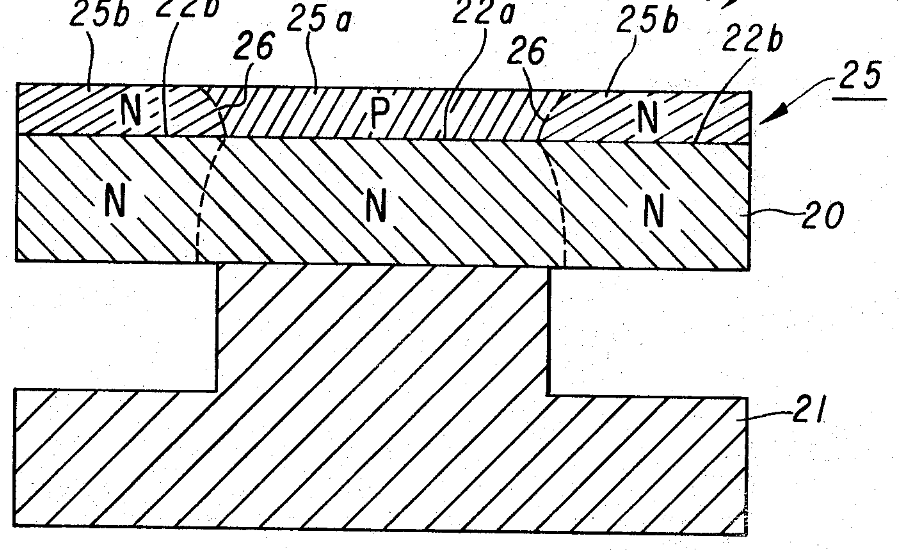
FIG. 4 is a pictorial view, in section, of a germanium substrate disposed on a heated susceptor depicting the epitaxially deposited layer with its N and P conductivity-type regions and the P-N junctions therebetween formed according to the invention.

As the deposition is continued, the epitaxial layer 25 is built up from the substrate 20 to the desired thickness as seen in FIG. 4. As described in conjunction with FIG. 3, the P type region 25*a* is formed on the hotter portion 22*a* of the substrate surface due to the surface temperature being high enough to cause the boron chloride to react with hydrogen, freeing the boron along with the reaction of the germanium chloride to free germanium, thus forming the boron doped, P type, germanium portion 25*a* of the deposited layer 25.

While the colder portions 22*b* of the substrate are hot enough to cause the germanium chloride to react and deposit germanium thereon the temperature is below the effective reaction temperature of boron chloride at the flow rate used, so that the cooler portions 25*b* of the deposited layer 25 are essentially boron free and are thus N type germanium, due to impurities from the underlying N type substrate, as previously explained. The susceptor 21 can be patterned to furnish almost any pattern of P and N type regions with their respective P-N junctions 26. For isolation purposes in integrated circuits, a grid of highly doped isolation regions could be formed in the epitaxial layer to isolate each circuit component from each other.

Various modifications of the invention will become apparent to persons skilled in the art without departing from the spirit and scope of the invention as defined by the appended claims.

What is claimed is:

1. A method for epitaxially depositing a semiconductor layer having at least one region of P-type conductivity adjacent a region of N-type conductivity comprising the steps of:

(a) heating a monocrystalline semiconductor substrate of one conductivity type to a temperature sufficiently high to effect epitaxial deposition;

(b) maintaining certain portions of the substrate at a temperature substantially higher than other portions of the substrate;

(c) passing in contact with said heated substrate a vaporous or gaseous mixture containing a decomposable compound of the same semiconductor as said substrate and a decomposable compound of an impurity capable of producing a conductivity type opposite that of said substrate for a period of time sufficient to deposit an epitaxial layer of said semiconductor material over the surface of said substrate; and (d) correlating the flow rate of said impurity compound with the temperature profile on the surface of the substrate and the impurity concentration in the substrate to yield epitaxial material of the opposite conductivity type with respect to said substrate on the hotter portion thereof, and epitaxial material of the same conductivity type as said substrate in contact with the cooler portions of the substrate.

2. The method as defined in claim 1, wherein said semiconductor substrate and semiconductor material are taken from the group consisting of germanium, silicon, or gallium arsenide.

3. A method of forming an epitaxial germanium layer having adjacent regions therein of opposite conductivity types comprising the steps of:

(a) differentially heating a surface of a monocrystalline germanium substrate of one conductivity type to maintain on said surface a first area heated to a first temperature sufficiently high to effect epitaxial deposition, and a second area heated to a substantially higher temperature;

(b) passing a vaporous or gaseous mixture in contact with said heated substrate containing hydrogen, a decomposable germanium compound and a decomposable compound of an impurity corresponding to a conductivity type opposite that of said substrate for a period of time sufficient to deposit an epitaxial layer of germanium on the surface of said substrate; and (c) coordinating the flow rate of said impurity compound with the concentration of impurities in said substrate and the temperature of said substrate surface to yield an epitaxial layer having the same conductivity type as said substrate covering the relatively cooler portion of said substrate and having the opposite conductivity type covering the relatively hotter area of said substrate.

4. The method as defined in claim 3, wherein said heating of said one surface of said substrate is accomplished by placing said substrate on a heated susceptor of the desired geometry.

5. The method as defined in claim 3, wherein said vapor passing over said surface contains 50 p.p.m. of boron hydride in hydrogen flowing at a rate of 1.5 cc./min.

6. The method as defined in claim 3, wherein said germanium containing compound is germanium tetrachloride and said impurity containing compound is diborane.

References Cited

UNITED STATES PATENTS

| | | | |
|---|---|---|---|
| 3,200,018 | 8/1965 | Grossman | 317—235 X |
| 3,293,087 | 12/1966 | Porter | 148—175 |
| 3,458,368 | 7/1969 | Haberecht | 148—175 |

FOREIGN PATENTS

| | | |
|---|---|---|
| 846,720 | 8/1960 | Great Britain. |

CHARLES N. LOVELL, Primary Examiner